United States Patent
Wang et al.

(10) Patent No.: US 8,524,562 B2
(45) Date of Patent: Sep. 3, 2013

(54) METHOD FOR REDUCING FERMI-LEVEL-PINNING IN A NON-SILICON CHANNEL MOS DEVICE

(75) Inventors: Wei-E Wang, Overijse (BE); Han Chung Lin, Leuven (BE); Marc Meuris, Keerbergen (BE)

(73) Assignee: IMEC, Leuven (BE)

( * ) Notice: Subject to any disclaimer, the term of this patent is extended or adjusted under 35 U.S.C. 154(b) by 586 days.

(21) Appl. No.: 12/560,282

(22) Filed: Sep. 15, 2009

(65) Prior Publication Data

US 2010/0065824 A1 Mar. 18, 2010

Related U.S. Application Data

(60) Provisional application No. 61/097,431, filed on Sep. 16, 2008.

(51) Int. Cl.
*H01L 21/336* (2006.01)

(52) U.S. Cl.
USPC .... 438/285; 438/289; 438/290; 257/E21.085; 257/E21.4

(58) Field of Classification Search
USPC .......................................... 438/285
See application file for complete search history.

(56) References Cited

U.S. PATENT DOCUMENTS

| | | | | |
|---|---|---|---|---|
| 5,616,947 A | * | 4/1997 | Tamura | 257/410 |
| 6,025,281 A | * | 2/2000 | Passlack et al. | 438/779 |
| 2002/0086557 A1 | | 7/2002 | Matsumura et al. | |
| 2007/0252223 A1 | * | 11/2007 | Lee et al. | 257/411 |
| 2009/0243031 A1 | * | 10/2009 | Natzle et al. | 257/508 |
| 2009/0256211 A1 | * | 10/2009 | Booth et al. | 257/407 |

FOREIGN PATENT DOCUMENTS

| | | |
|---|---|---|
| CA | 2024134 | 10/1993 |
| EP | 1 403 913 A1 | 3/2004 |

OTHER PUBLICATIONS

C.L. Hinkle et al., "Frequency dispersion reduction and bond conversion on n-type GaAs by in situ surface oxide removal and passivation", American Institute of Physics, Applied Physics Letters 91, 163512-1-3, Oct. 2007.*

Hinkle, C.L., et al. Frequency dispersion reduction and bond conversion on n-type GaAs by in situ surface oxide removal and passivation, Applied Physics Letters, Oct. 19, 2007, vol. 91, No. 16.

(Continued)

*Primary Examiner* — Daniel Whalen
(74) *Attorney, Agent, or Firm* — Knobbe, Martens Olson & Bear, LLP

(57) ABSTRACT

A method to reduce (avoid) Fermi Level Pinning (FLP) in high mobility semiconductor compound channel such as Ge and III-V compounds (e.g. GaAs or InGaAs) in a Metal Oxide Semiconductor (MOS) device. The method is using atomic hydrogen which passivates the interface of the high mobility semiconductor compound with the gate dielectric and further repairs defects. The methods further improve the MOS device characteristics such that a MOS device with a quantum well is created.

20 Claims, 14 Drawing Sheets

Side view

Side view

(56) References Cited

OTHER PUBLICATIONS

Mingxiang, et al. Application of Hydrogenation to Improve GaAs/Si MESFETs and IC Performance by PECVD SiN, Japanese Journal of Applied Physics, Jan. 1, 1990.

Löfdahl, et al. Difference in hydrogen sensitivity between Pt and Pd field-effect devices, Journal of Applied Physics, Apr. 1, 2002, vol. 91, No. 7.

Ngai, T., et al. Improving SiO2/SiGe interface of SiGe p-metal-oxide-silicon field-effect transistors using water vapor annealing, Applied Physics Letters, Mar. 11, 2002, vol. 80, No. 10.

Parikh, P.A., et al. Hydrogenation of GaAs MIS FET s with Al2O3 as the gate insulator, Electronics Letters, Aug. 29, 1996, vol. 32, No. 18.

* cited by examiner

PRIOR ART

PRIOR ART

PRIOR ART

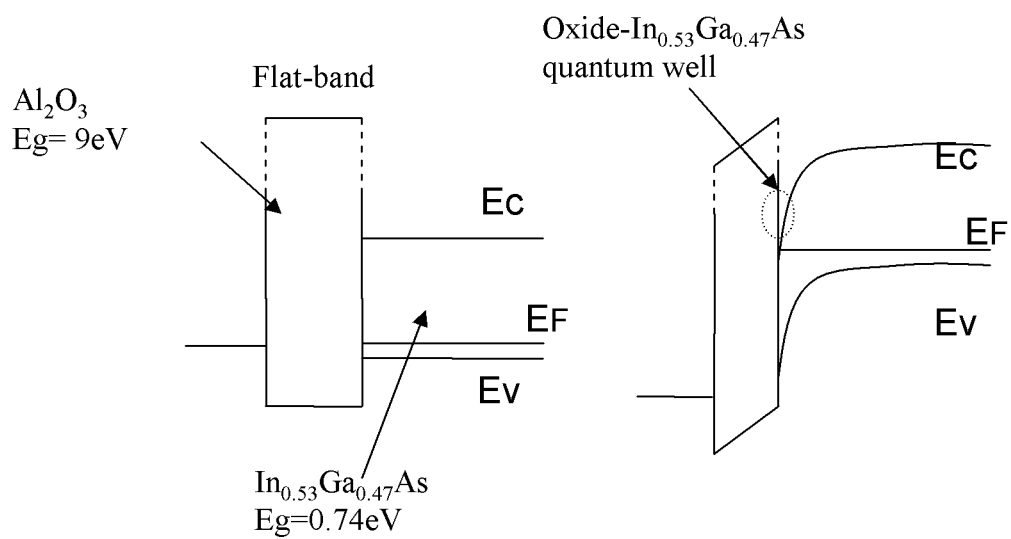
Figure 8A                    Figure 8B

US 8,524,562 B2

METHOD FOR REDUCING FERMI-LEVEL-PINNING IN A NON-SILICON CHANNEL MOS DEVICE

CROSS-REFERENCE TO RELATED APPLICATIONS

This application claims the benefit under 35 U.S.C. §119 (e) of U.S. provisional application Ser. No. 61/097,431, filed Sep. 16, 2008, the disclosure of which is hereby expressly incorporated by reference in its entirety and is hereby expressly made a portion of this application.

FIELD OF THE INVENTION

The present disclosure relates to the use of high mobility materials such as Ge and III-V compounds (e.g. GaAs or InGaAs) as a channel in a Metal Oxide Semiconductor (MOS) device thereby replacing silicon. More particular, the present disclosure relates to a method for reducing (avoiding) Fermi Level Pinning (FLP) in high mobility materials such as in a Ge or III-V semiconductor compound based channel in a MOS device. The present disclosure further relates to passivation methods which reduces drastically (avoiding) FLP.

BACKGROUND OF THE INVENTION

Continued physical scaling of mainstream silicon CMOS (Complementary Metal Oxide Semiconductor) and MOSFET (Metal Oxide Semiconductor Field effect transistor) technology in general has boosted the performance of the silicon devices in the last 40 years. However, even the benefits of the recently introduced new materials like high-k dielectrics and metal gates cannot guarantee that the race towards smaller devices will still be sustainable in terms of performance enhancement beyond the 22 nm node.

A possible solution, at least for the next technology nodes, could be the introduction of new channel materials with higher carrier mobility. Germanium and III-V compounds such as InSb, InAs, Ge and InGaAs with high electron mobility are very promising materials and possible solutions for CMOS devices beyond 22 nm.

Development of the III-V compound CMOS devices have been suffering from the Fermi level pinning (FLP) issues for the last four decades. FLP issue, suspected arising from the very high interfacial trap density of III-V compound interface with the gate dielectric, is one of the key showstoppers to refrain III-V CMOS from replacing the conventional Si CMOS. Currently, there are many ways suggested to avoid FLP including chalcogenide passivation, silicon passivation, and the like. The most popular state of the art technique is the use (deposition) of an interfacial passivation layer (IPL) e.g. Si or Ge in between the high mobility III-V compound semiconductor and the gate dielectric layer. Introduction of an IPL has however many unwanted effects such as a significant reduction in electron mobility of the channel. The physical thickness of interfacial passivation layer inevitably adds extra EOT to the gate stack and has a negative impact to the channel scaling budget (EOT<0.8 nm at 16 nm node). Furthermore, the diffusion of Si or Ge into III-V substrate under high temperature process such as implant activation anneals (>650 C) can alter the substrate doping significantly. Finally, the application of more than several nanometers of IPL material (Si or Ge, with 400 $cm^2/eV$ and 1900 $cm^2/eV$ electron mobility respectively) will likely degrade the high carrier mobility of the substrate (8000 $cm^2/eV$ for $In_{0.53}Ga_{0.47}As$).

It is a consensus of the industry to date that the optimal removal of FLP in a III-V CMOS device has not yet been achieved and there is still a need for methods which reduce or avoid the Fermi level pinning and at the same time enhances the device performance.

SUMMARY OF THE INVENTION

The present disclosure aims to reduce Fermi Level Pinning (FLP) in a high mobility material such as a Ge (SiGe) or III-V semiconductor compound based channel in a MOS device.

More specifically, the present disclosure aims to reduce FLP and in the mean time to enhance the device characteristics significantly.

The present disclosure furthermore aims to integrate InGaAs/Ge for high performance MOS devices with an emphasis on progressive EOT (Equivalent Oxide Thickness) scaling.

The present disclosure relates to a method for avoiding or at least reducing drastically the Fermi Level Pinning (FLP) effects in new channel materials with higher carrier mobility such as a Ge or III-V compound based channel of a MOS device and thereby improving the device performance drastically. In Ge (SiGe) and III-V based materials said Fermi Level Pinning (FLP) effects are arising from the very high interfacial trap density at the Ge (SiGe) or III-V compound semiconductor interface with the gate dielectric situated above said compound semiconductor.

Using the method of the disclosure for reducing (avoiding) the FLP at the interface of the gate dielectric (oxide) and the Ge (SiGe) or III-V semiconductor material such as InGaAs (e.g. $In_{0.53}Ga_{0.47}As$), it is furthermore possible to achieve a MOS device with a field-induced surface quantum well.

Using the method of the disclosure for reducing (avoiding) the FLP at the interface of the gate dielectric (oxide) and the Ge (SiGe) or III-V channel material such as $In_{0.53}Ga_{0.47}As$, a high frequency inversion lift (HFIL) is observed on the CV curve because the channel interface has a very low defectivity and high mobility.

According to preferred embodiments of the disclosure a method is disclosed to fabricate a device having a channel made of a Ge (SiGe) or III/V semiconductor compound high mobility material thereby avoiding the problem of FLP. Preferably said device is a MOS device comprising a Ge (SiGe) or alternatively a III-V compound based channel or in other words a device utilizing high mobility Ge (SiGe) or III-V materials (such as GaAs or InGaAs) as the channel material and thereby replacing conventionally used silicon based channels. Since the FLP issue is suspected arising from defects in the high mobility material and/or probably due to native oxides on the surface of the Ge (SiGe) or III-V compound semiconductor, it is extremely important to passivate the surface of the III-V compound semiconductor. The method avoids the use (deposition) of an interfacial passivation layer (IPL) (e.g., Si or Ge) in between the high mobility III-V compound semiconductor and the gate dielectric layer.

The method of the preferred embodiments uses a passivation technique which can not only reduce (eliminate) the FLP but also can enhance the device characteristics significantly.

The method of preferred embodiments solves the problem of FLP by passivating the high mobility material at the interface of the gate dielectric and the Ge or III-V compound semiconductor and at the same time repairing the defects at said interface. The problem is solved by performing an atomic hydrogen anneal or a forming gas anneal in the form of a Catalytic Forming Gas Anneal (C-FGA) in order to achieve atomic hydrogen. Said atomic hydrogen anneal is preferably a non-damaging plasma hydrogen anneal such as the use of a remote plasma. Said C-FGA is preferably a FGA performed in the presence of certain noble metals such as Pt or Pd which transforms molecular hydrogen into atomic hydrogen. The atomic hydrogen anneal step is preferably performed before depositing the gate electrode. Alternatively said atomic hydrogen anneal step is performed after depositing the gate electrode or in other words after creation of the MOS structure.

According to preferred embodiments, a method is disclosed for reducing (avoiding) Fermi Level Pinning in a germanium (Ge, SiGe) or III-V high mobility compound channel of a metal oxide semiconductor (MOS) device, the method comprising at least the steps of:

providing a high mobility Ge (SiGe) or III-V compound semiconductor on a substrate to form the channel of the MOS device, forming a gate dielectric on the compound semiconductor, providing a gate electrode onto the gate dielectric to form a gate of the MOS device, and performing an anneal with atomic hydrogen for at least 5 minutes.

According to preferred embodiments, said MOS device may be a MOSCAP, MOSFET, HEMT, or the like, including a high mobility Ge (SiGe) or III-V compound semiconductor based channel which can be a surface channel or a buried channel.

According to preferred embodiments said MOS device is a MOSFET including a high mobility Ge (SiGe) or III-V compound based channel and the method for reducing (avoiding) the FLP effect in said MOSFET comprises at least the steps of:

forming a high mobility Ge (SiGe) or III-V compound semiconductor on a substrate to form a channel of the MOSFET device, doping a first and second region of the semiconductor compound with a suitable dopant type to form a drain and a source of the MOSFET, forming a gate dielectric on the semiconductor compound, providing a gate electrode onto the gate dielectric to form a gate electrode of the MOSFET, and perform an anneal using atomic hydrogen for at least 5 minutes.

According to preferred embodiments the substrate is chosen such that a dislocation free growth of the high mobility compound semiconductor onto the substrate is possible.

According to preferred embodiments the substrate may be made of Si (e.g. a Si wafer), InP, or the like.

According to preferred embodiments the III-V compound semiconductor is InGaAs, preferably $In_xGa_{1-x}As$ with x>0.5 and more preferably $In_{0.53}Ga_{0.47}As$. The III-V compound semiconductor is preferably lattice matched towards the underlying substrate, e.g. $In_{0.53}Ga_{0.47}As$ can be grown lattice matched onto a Si substrate using state of the art techniques.

According to preferred embodiments the compound semiconductor is Ge or $Si_xGe_{1-x}$ with x<0.3. The Ge compound semiconductor is preferably deposited dislocation free onto the underlying substrate. Said substrate may be made of Si, Ge, or the like. Optionally said Ge or $Si_xGe_{1-x}$ is being annealed to achieve a GeOx (most preferably $GeO_2$) top surface layer.

According to preferred embodiments the grown Ge (SiGe) compound semiconductor or III-V compound semiconductor e.g. $In_{0.53}Ga_{0.47}As$ further undergoes a chalcogenide passivation process in order to remove the native oxides. In case the compound semiconductor is Ge, the formation of a GeOx (most preferably $GeO_2$) top surface layer is avoided (not needed). To achieve the chalcogenide passivation the method further includes the step of dipping the substrate in a solution of 40-48% wt %, $(NH_4)_2S$ for 5 to 10 minutes and rinse to dry with de-ionized water. Alternatively state of the art $H_2S$ (gas) treatments may be used to perform the chalcogenide passivation. The chalcogenide passivation step is performed before the step of forming a gate dielectric 17 on the Ge (SiGe) or III-V compound semiconductor.

According to preferred embodiments the step of forming a gate dielectric onto the Ge (SiGe) or III-V compound semiconductor comprises depositing an oxide selected from a group consisting of $Al_2O_3$, $HfO_2$, $ZrO_2$, $Ga_2O_3$, $Gd_2O_3$, $Y_2O_3$, $TiO_2$, $Ta_2O_5$, $La_2O_3$, HfAlO, TiAlO, and $La_xAl_{1-x}O_3$ ($LaAlO_3$)

According to preferred embodiments the step of forming a gate dielectric layer onto the Ge (SiGe) or III-V compound semiconductor comprises depositing a layer of $Al_2O_3$ through atomic layer deposition (ALD) or alternatively Molecular Beam Epitaxy (MBE). The thickness of the deposited gate dielectric may be in the range of 5 nm up to 20 nm to fabricate a MOSCAP device and within an EOT thickness <1 nm to fabricate a MOSFET device.

According to preferred embodiments the step of providing a gate electrode onto the gate dielectric is performed using deposition techniques such as Physical Vapor Deposition (PVD), e-beam evaporation and RF sputtering, or the like. The thickness of the deposited gate electrode structure may be in the range of 50 nm up to 200 nm. The gate electrode (metal) layer is subsequently patterned to form a gate electrode structure using state of the art patterning techniques to achieve the suitable gate structure.

According to preferred embodiments the step of performing the hydrogen anneal is performed using atomic hydrogen anneal e.g. using a remote plasma with 10%-100% atomic hydrogen in an inert carrier gas, preferably at a temperature in the range of 200° C. up to 500° C., more preferred in the range of 300° C. up to 500° C. for about at least 5 up to 30 minutes. This method is non-destructive compared to state of the art techniques used to passivate the Ge (SiGe) or III-V compound semiconductor e.g. using a plasma treatment involving energy bombardment. Compared to state of the art MOS devices having a Ge or III-V compound semiconductor channel this is the first time the FLP is reduced and almost eliminated using an ex-situ "repair" method without the need to deposit an extra interfacial layer made of a different material.

According to preferred embodiments the step of performing the hydrogen anneal is performed using C-FGA in combination with noble metals such as Pt and Pd, whereby said noble metals are acting as a catalyst to dissociate molecular hydrogen into atomic hydrogen. Said C-FGA is preferably performed at a temperature in the range of 200° C. up to 500° C., more preferred in the range of 300° C. up to 500° C. for about at least 5 up to 30 minutes.

According to preferred embodiments the step of performing the hydrogen anneal is performed using C-FGA which is performed after depositing a gate electrode onto said gate dielectric and wherein said gate electrode comprises a noble metal such as Pt or Pd which transforms molecular hydrogen into atomic hydrogen.

According to an alternative and also preferred embodiment the step of performing the atomic hydrogen anneal is performed using deuterium (e.g. 10%-100%), preferably at a temperature in the range of 200° C. up to 500° C., more preferred between 300° C. up to 400° C. for about at least 5 up to 30 minutes.

According to preferred embodiments, a method is disclosed of forming a MOS device including a high mobility Ge (SiGe) or III-V compound semiconductor based channel whereby a field-induced surface quantum well is created at the interface between the Ge (SiGe) or III-V compound and the gate dielectric.

Using the method of the preferred embodiments a high frequency inversion lift (HFIL) is observed on the CV curve because the channel interface has a very low defectivity and high mobility. The obtained high mobility MOS device has a high frequency inversion lifting (HFIL) in the range of 10% up to 20%.

According to preferred embodiments a MOS device is disclosed comprising a high mobility III-V semiconductor compound based channel wherein a (surface) quantum well is created and observed at the gate dielectric-semiconductor compound based channel interface. Said device comprises at least:
- a substrate,
- an $In_xGa_{1-x}As$ (with x>0.5) and more preferably $In_{0.53}Ga_{0.47}As$ semiconductor compound channel formed (dislocation free) on the substrate, and
- a gate dielectric being formed on the $In_xGa_{1-x}As$ semiconductor compound channel, and
- a gate electrode being deposited on the gate dielectric.

According to preferred embodiments said MOS device comprising a high mobility $In_xGa_{1-x}As$ (preferably $In_{0.53}Ga_{0.47}As$) semiconductor compound based channel having a (surface) quantum well further comprises a first and second region within the $In_xGa_{1-x}As$ semiconductor compound which is doped with an n-type dopant to form a source and drain of the MOS device and an $In_xGa_{1-x}As$ semiconductor compound channel which is being doped with a p-type dopant to form an N-MOS device with a (surface) quantum well.

According to an alternative and also preferred embodiment a MOS device is disclosed comprising a high mobility Ge (SiGe) semiconductor compound based channel wherein a (surface) quantum well is created and observed at the gate oxide-semiconductor compound based channel interface. Said device preferably comprises:
- a substrate,
- a Ge or SiGe semiconductor compound channel formed on the substrate optionally being annealed to form a thin $GeO_x$ surface layer on top of the semiconductor compound, and
- a gate dielectric being formed on the Ge (SiGe) semiconductor compound, and
- a gate electrode being deposited on the gate dielectric.

According to preferred embodiments said MOS device comprising a high mobility Ge (SiGe) semiconductor compound based channel having a (surface) quantum well further comprises a first and second region within the Ge (SiGe) semiconductor compound which is doped with a p-type dopant to form a source and drain of a MOS device and a Ge (SiGe) semiconductor compound channel which is being doped with an n-type dopant to form a P-MOS device.

According to preferred embodiments a high mobility CMOS device is disclosed comprising a high mobility P-MOSFET and a high mobility N-MOSFET. Said CMOS device is preferably comprising a Ge (SiGe) semiconductor compound P-MOSFET wherein the source and drain regions are doped with a p-type dopant. Said CMOS device is preferably further comprising an $In_xGa_{1-x}As$ (preferably $In_{0.53}Ga_{0.47}As$) semiconductor compound N-MOSFET wherein the source and drain regions are doped with an n-type dopant.

According to preferred embodiments a field-induced surface quantum well is achieved within the high mobility MOS device by passivating the interface between the gate oxide and the semiconductor compound. Said passivation is performed using the method of the preferred embodiments making use of an anneal process with atomic hydrogen. Said hydrogen anneal may be C-FGA (molecular hydrogen) in combination with a noble metal, alternatively atomic hydrogen may be used. The hydrogen anneal may be performed before or after the step of depositing the gate electrode.

Particular and preferred aspects are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics, features and advantages of the present disclosure will become apparent from the following detailed description, taken in conjunction with the accompanying drawings, which illustrate, by way of example, the principles of the preferred embodiments. This description is given for the sake of example only, without limiting the scope of the preferred embodiments. The reference figures quoted below refer to the attached drawings.

BRIEF DESCRIPTION OF THE DRAWINGS

Exemplary embodiments are illustrated in referenced figures of the drawings. It is intended that the embodiments and figures disclosed herein are to be considered illustrative rather than restrictive.

FIGS. 8A-8B illustrate gate dielectric (oxide)-InGaAs field-induced surface quantum well formation in a III/V MOS capacitor comprising MOSFET stack according to preferred embodiments of disclosure.

FIG. 9A illustrates the behavior at 1 MHz without performing the C-FGA; FIG. 9B illustrates the behavior at 1 MHz after performing the C-FGA according to preferred embodiments of the preferred embodiments thereby illustrating a true inversion at 1 MHz and formation of a field-induced surface quantum well.

FIG. 10A illustrates the CV curve for a Ge MOS capacitor without performing a C-FGA and FIG. 10B illustrates the CV curve for a Ge MOS capacitor after performing the C-FGA according to preferred embodiments of the preferred embodiments showing a true inversion response and a bias independent characteristic at inversion. The MOS capacitor was measured from 1 KHz to 1 MHz, with a total of 30 frequencies.

DETAILED DESCRIPTION OF THE PREFERRED EMBODIMENT

Figure 1:
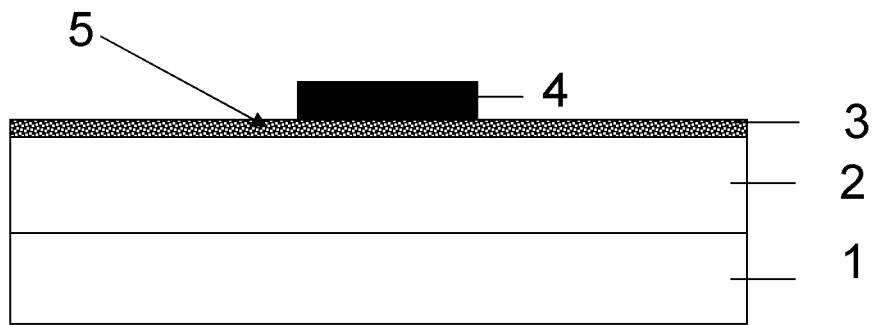
FIG. 1 illustrates a suitable MOS capacitor stacks according to preferred embodiments.

Embodiments of the present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn to scale for illustrative purposes. The dimensions and the relative dimensions do not correspond to actual reductions to practice of the disclosure.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the disclosure described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

Whenever reference is made hereinafter to a particular dopant type, this is done for the ease of explanation only and is not intended to limit the disclosure. It is to be understood that in the examples given herein below, materials and dopant types may be replaced by other suitable materials and dopant types, without changing the disclosure.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising components A and B" should not be limited to devices consisting only of components A and B. It means that with respect to the present disclosure, the only relevant components of the device are A and B.

Reference is made through the application to the term EOT (Equivalent Oxide Thickness) which refers to a distance, usually given in nanometers (nm), which indicates how thick a silicon oxide film would need to be to produce the same effect as when a high-k material is being used.

Reference is made through the application of the phenomenon "High frequency inversion lift" (referred to as HFIL) which is the phenomenon in which the CV reveals a step up (lift) at the strong inversion even at high frequency. HFIL can be quantified as a ratio of $C_{inv}$ increment at strong inversion with respect to Cox, i.e., $HFIL=((C_{inv}-C_{min})/C_{ox}$, where $C_{min}$ is the minimum capacitance observed at deep depletion. For a prior art Si MOS-CAP the HFIL=0 at about 100 Hz. Using the method of the preferred embodiments (after C-FGA) on a high mobility InGaAs MOS-CAP the HFIL is ~0.2 at 1 MHz and on a high mobility Ge MOS-CAP the HFIL~0.1 at 1 MHz.

Reference is made through the application of the process "Catalytic Forming Gas Anneal" (referred to as C-FGA). This is an hydrogen anneal treatment technique (using Pd or Pt as catalytic) used to reveal the above HFIL Reference is made towards group III/V compound semiconductor materials, this refers to materials comprising In, Ga, As, Sb, Al, P, B, N and the binary, tertiary or quaternary compounds thereof such as InGaAs.

It is further to be noticed that the term "quantum well" refers to a thin surface layer which can confine (quasi-)particles (typically electrons or holes) in the dimension perpendicular to the layer surface, whereas the movement in the other dimensions is not restricted. The confinement itself is referred to as a quantum effect.

The disclosure will now be described by a detailed description of several embodiments of the preferred embodiments. It is clear that other embodiments of the preferred embodiments can be configured according to the knowledge of persons skilled in the art without departing from the true spirit or technical teaching of the preferred embodiments, the disclosure being limited only by the terms of the appended claims.

At least some preferred embodiments are concerned with the problem of Fermi Level pinning (FLP) effects in high mobility materials (such as a Ge (SiGe) or III-V compounds) which are used as a channel in a MOSFET device.

The disclosure discloses a passivation method to reduce drastically (avoiding) FLP and repair defects at the interface of the Ge (SiGe) or III-V compound semiconductor 2 channel and the gate dielectric 3 of a MOS device (see FIG. 1). The preferred embodiments further discloses a MOS device comprising a high mobility Ge (SiGe) or III-V compound semiconductor channel using the passivation method of the preferred embodiments.

Preferred embodiments relates to a MOS device using the passivation method of the preferred embodiments having a p-$In_{0.53}Ga_{0.47}As$ compound semiconductor channel whereby high frequency inversion lift is observed and a field-induced surface quantum well is created at the interface of the gate dielectric/In$_{0.53}$Ga$_{0.47}$As channel.

Preferred embodiments relates to a MOS device using the passivation method of the preferred embodiments having a n-Ge compound semiconductor channel whereby high frequency inversion lift is observed and a field-induced surface quantum well is created at the interface of the gate dielectric/Ge channel.

According to preferred embodiments, a method is provided which aims at reducing drastically (preferably avoiding) Fermi Level pinning effects in a high mobility MOS device by passivating the interface of the Ge (SiGe) or III-V compound semiconductor based channel with the gate dielectric. The method of the preferred embodiments is able to reduce (avoid) FLP in a Ge (SiGe) or III-V compound based channel (more specifically at the interface with the gate dielectric) such as e.g. In$_{0.53}$Ga$_{0.47}$As and in the mean time is able to enhance the device characteristics significantly.

The passivation method according to the disclosure is based on a hydrogen passivation treatment performed on the interface of the Ge (SiGe) or III-V compound based channel with the gate dielectric. Said hydrogen passivation is based on atomic hydrogen.

In case a Forming Gas Anneal (FGA) is used, Catalytic-FGA (C-FGA) is used. To achieve C-FGA a catalyst to convert molecular hydrogen into atomic hydrogen must be present. Said atomic hydrogen can penetrate through the gate dielectric and subsequently repair defects at the interface of the Ge (SiGe) or III-V compound based channel with the gate dielectric and passivate the Ge (SiGe) or III-V compound at the interface. In case atomic hydrogen is used, there is no need to have a catalyst (e.g. noble metal).

According to an alternative and also preferred embodiment the step of performing the atomic hydrogen anneal is performed using deuterium (e.g. 10%-100%), preferably at a temperature in the range of 200° C. up to 500° C., more preferred between 300° C. up to 400° C. for about at least 5 up to 30 minutes. The use of deuterium as an alternative for hydrogen is due to its chemical similarities to hydrogen. In addition, deuterium may also have other desirable bonding properties, as seen in the Si channel CMOS.

Figure 2A:
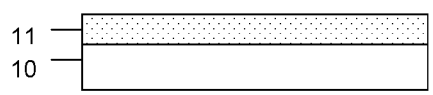
FIGS. 2A-2H illustrate the process flow according to preferred embodiments of disclosure to fabricate a metal oxide semiconductor field-effect transistor (MOSFET) including a high mobility Ge or III-V compound based channel thereby avoiding (eliminating) the FLP effect.

The passivation method according to a preferred embodiment is illustrated in FIG. 2A up to 2H. The method starts with the step of forming a Ge (SiGe) or III-V compound semiconductor 11 onto a substrate 10 to form a channel of the MOS device as illustrated in FIG. 2A.

According to preferred embodiments said substrate is chosen such that dislocation free growth of the compound semiconductor is possible. Said substrate may be InP, Si, or the like.

According to preferred embodiments said III-V compound semiconductor 11 is InGaAs, preferably In$_x$Ga$_{1-x}$As with x>0.5 and more preferably In$_{0.53}$Ga$_{0.47}$As. The III-V compound semiconductor is preferably lattice matched towards the underlying substrate, e.g. In$_{0.53}$Ga$_{0.47}$As can be grown lattice matched (dislocation free) onto the substrate. Using state of the art techniques it is also possible to grow In$_{0.53}$Ga$_{0.47}$As dislocation free onto a Si substrate.

According to preferred embodiments said Ge compound semiconductor 11 is Ge or Si$_x$Ge$_{1-x}$ with x<0.3.

According to preferred embodiments said grown Ge (SiGe) or III-V semiconductor compound 11 e.g. In$_{0.53}$Ga$_{0.47}$As may undergo a chalcogenide passivation process to remove the native oxides. To achieve the chalcogenide passivation a further step of dipping the substrate in a solution of 40-48% wt %, (NH$_4$)$_2$S solution for 5 to 10 minutes and rinse to dry with de-ionized water is applied. Alternatively state of the art H$_2$S (gas) treatments may be used to perform the chalcogenide passivation. The chalcogenide passivation step is preferably performed before the step of forming a gate dielectric 15 on the compound semiconductor 11.

According to alternative and also preferred embodiments the Ge semiconductor compound 11 is annealed to form a thin surface (top) layer made of GeOx (preferably GeO$_2$). GeOx grown naturally in air (with moisture) is very bad and not preferred. A GeOx top surface grown by using an oxygen plasma or ozone is preferred. In case a thin surface (top) layer made of GeOx is grown, no chalcogenide passivation process is performed.

Figure 2B:
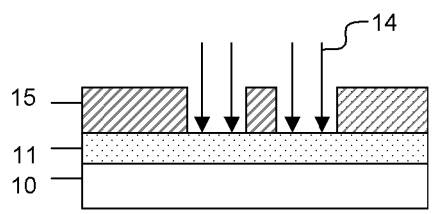
Figure 2C:
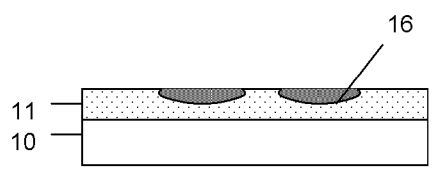

According to preferred embodiments and in a next step a first and second region 16 of the semiconductor compound are defined using conventional state of the art patterning techniques making use of a patterned photosensitive layer 15 on top of the Ge (SiGe) or III-V compound semiconductor and doped 14 with a second dopant type to form a drain and a source 16 of the MOSFET as illustrated in FIGS. 2B and 2C.

According to preferred embodiments and in case an N-MOSFET needs to be formed, a first and second region of the Ge (SiGe) or III-V compound semiconductor are doped with a n-type dopant type to form a drain and a source 16 of the N-MOSFET.

According to preferred embodiments and in case a P-MOSFET needs to be formed, a first and second region of the Ge (SiGe) or III-V compound semiconductor are doped with a p-type dopant type to form a drain and a source 16 of the P-MOSFET.

Figure 2D:
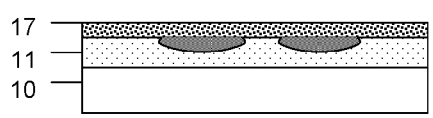

According to preferred embodiments and in a next step, a gate dielectric layer 17 is formed on the Ge (SiGe) or III-V compound semiconductor compound II using preferably atomic layer deposition as illustrated in FIG. 2D. The step of forming a gate dielectric layer onto the Ge (SiGe) or III-V compound semiconductor preferably comprises depositing an oxide selected from a group consisting of Al$_2$O$_3$, HfO$_2$, ZrO$_2$, Ga$_2$O$_3$, Gd$_2$O$_3$, Y$_2$O$_3$, TiO$_2$, Ta$_2$O$_5$, La$_2$O$_3$, HfAlO, TiAlO, and La$_x$Al$_{1-x}$O$_3$ (LaAlO$_3$). More preferably the step of forming a gate dielectric layer 17 onto the Ge (SiGe) or III-V compound semiconductor 11 comprises depositing a layer of Al$_2$O$_3$ on the InGaAs compound e.g. In$_{0.53}$Ga$_{0.47}$As through atomic layer deposition. The thickness of the deposited gate dielectric layer may be in the range of 10 nm.

Figure 2E:
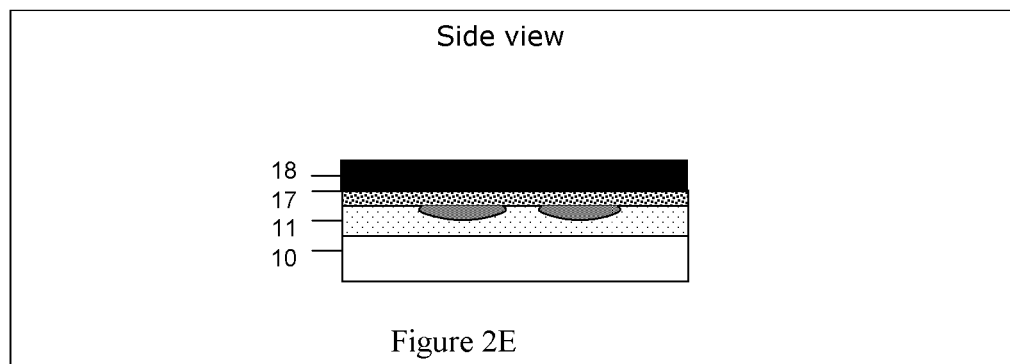

According to preferred embodiments and in a next step, as illustrated in FIG. 2E, a gate electrode layer 18 is deposited onto the gate dielectric layer 17. Said gate electrode layer is preferably performed using deposition techniques such as Physical Vapor Deposition (PVD), e-beam evaporation, or the like. The thickness of the deposited gate dielectric structure may be in the range of 50 nm up to 200 nm.

Figure 2F:
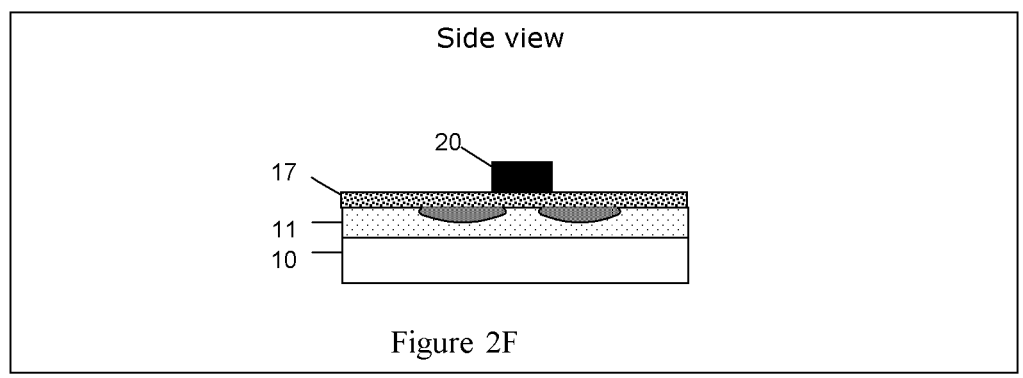
Figure 2G:
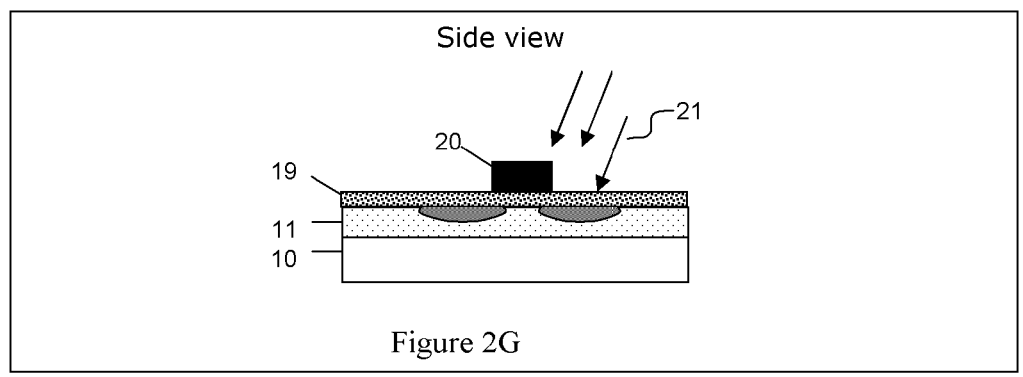
Figure 2H:
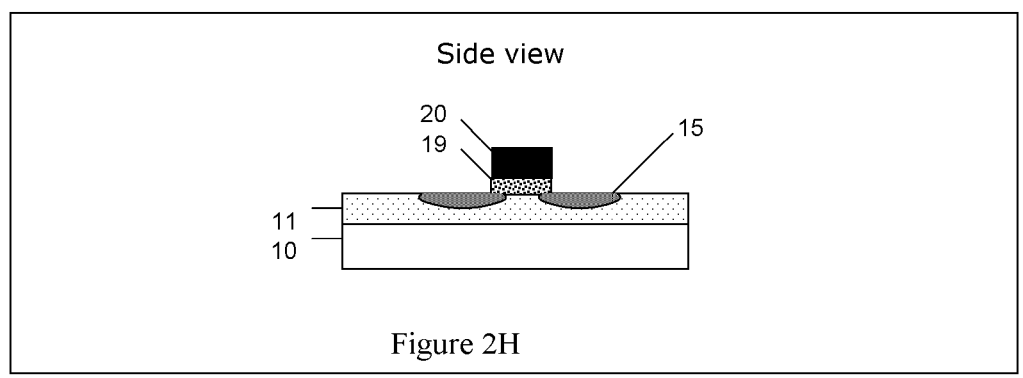
Figure 3:
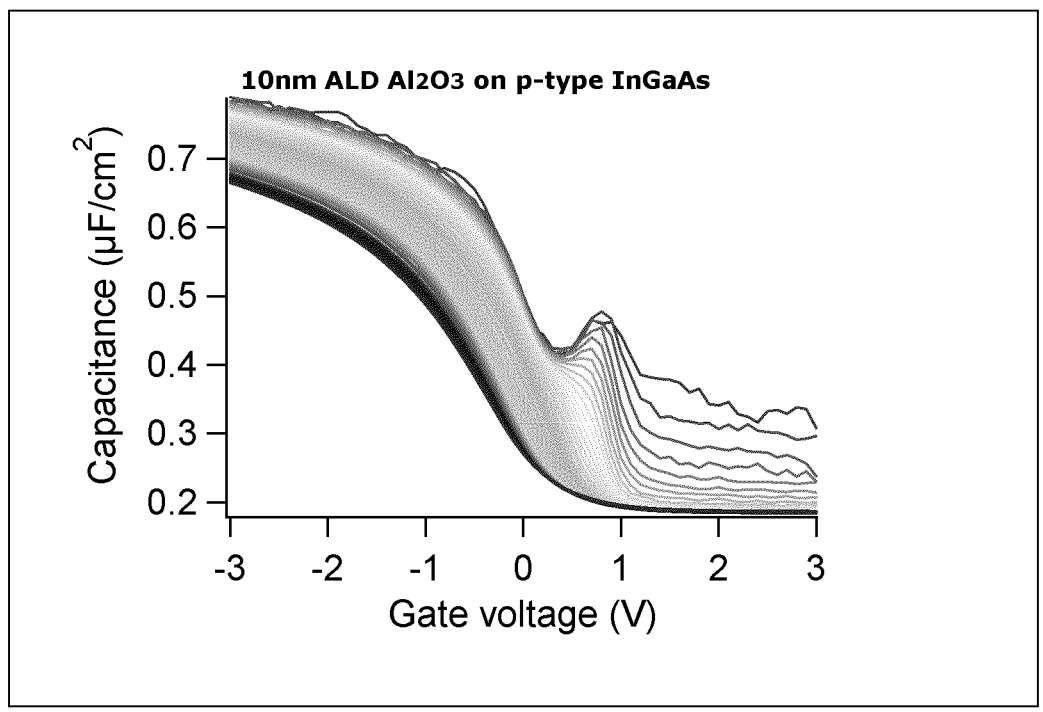
FIG. 3 illustrates the capacitance-voltage (C-V) curve for a MOS capacitor sample having a 10 nm $Al_2O_3$/p-type doped $In_{0.53}Ga_{0.47}As$ stack without the atomic hydrogen anneal (FGA) treatment (PRIOR ART).

According to preferred embodiments and in a next step, as illustrated in FIG. 2F, the gate electrode layer 18 is patterned using state of the art patterning techniques to form a gate electrode 20 of the MOSFET.

According to preferred embodiments and in a next step, the passivating technique is performed using an atomic hydrogen anneal 21. Said hydrogen anneal 21 is preferably performed for at least 5 minutes (e.g. 30 minutes). As an alternative, atomic hydrogen may be used but this is a more complicated and expensive method.

According to preferred embodiments the step of performing the atomic hydrogen anneal 21 is performed at a temperature in the range of 200° C. up to 500° C., more preferred in the range of 300° C. up to 500° C. for about at least 5 up to 30 minutes. This method is non-destructive compared to state of the art techniques used to passivate the Ge (SiGe) or III-V compound semiconductor e.g. using a plasma treatment involving energy bombardment. The atomic hydrogen anneal 21 step is preferably performed ex-situ and independent of the gate oxide deposition step. The presence of atomic hydrogen is essential and makes it possible to migrate (diffuse) through the gate oxide (dielectric) layer such that it can repair the defects and passivate the interface of the Ge (SiGe) or III-V semiconductor compound with the gate oxide layer.

According to an alternative and also preferred embodiment the step of performing the FGA is performed using deuterium, preferably at a temperature in the range of 200° C. up to 500° C., more preferred between 300° C. up to 400° C. for about at least 5 up to 30 minutes.

According to preferred embodiments a high mobility MOS device is disclosed using the method of the preferred embodiments to passivate the interface of a Ge (SiGe) or III-V compound based channel with the gate dielectric (see FIG. 1). Said device comprises at least:
- a substrate 1,
- a Ge (SiGe) or III/V compound semiconductor channel 2 formed on the substrate, and
- a gate dielectric 3 formed on the Ge (SiGe) or III/V compound semiconductor channel, and
- a gate electrode 4 being formed on top of the gate dielectric, wherein the HFIL is in the range of 10% up to 20%.

According to preferred embodiments said high mobility MOS device is having a passivated gate dielectric/Ge or III/V semiconductor compound interface using the hydrogen anneal of the preferred embodiments as described above. Using the hydrogen anneal makes it possible to achieve a HFIL in the range of 10% up to 20%.

According to preferred embodiments a HFIL in the range of 20% is achieved for a high mobility MOSFET comprising at least:
- a substrate,
- an $In_{0.53}Ga_{0.47}As$ semiconductor compound formed on the substrate
- a channel being formed in said $In_{0.53}Ga_{0.47}As$ semiconductor compound,
- a first region within the $In_{0.53}Ga_{0.47}As$ semiconductor compound doped with an n type dopant to form a drain of the MOSFET and a second region within the $In_{0.53}Ga_{0.47}As$ semiconductor compound doped with an n type dopant to form a source of the MOSFET such that an N-MOSFET is formed, and
- a gate dielectric selected from $Al_2O_3$ formed on the $In_{0.53}Ga_{0.47}As$ semiconductor compound, and
- a gate electrode being formed on top of the gate dielectric, provided that the interface of the gate dielectric/$In_{0.53}Ga_{0.47}As$ semiconductor compound is annealed using atomic hydrogen as described in preferred embodiments of the disclosure.

Figure 4:
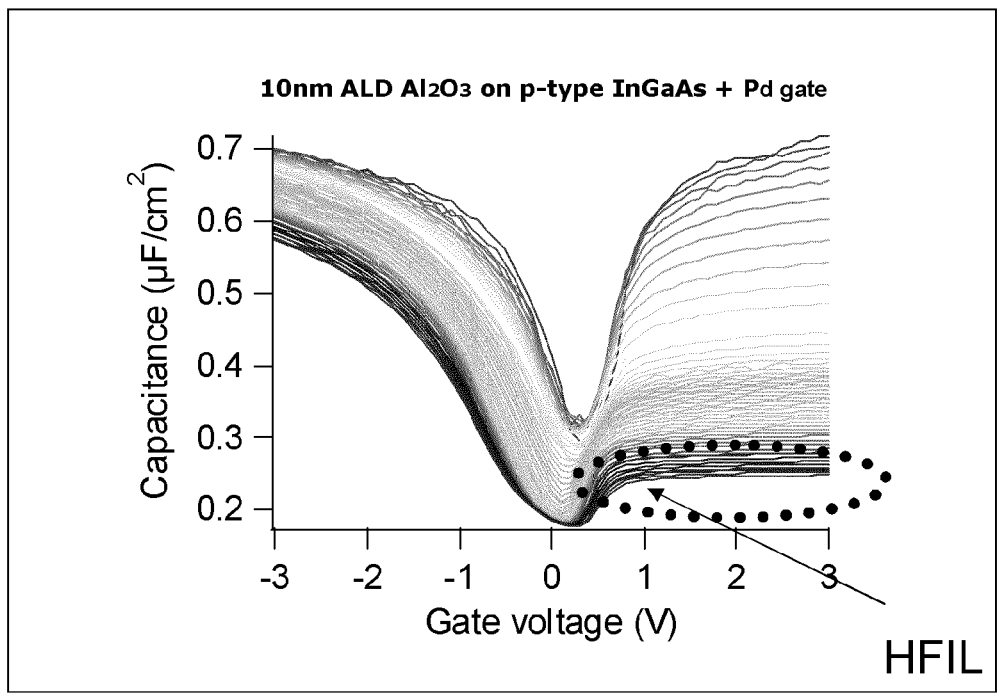
FIG. 4 illustrates the capacitance-voltage (C-V) curve for a MOS capacitor sample having a 10 nm $Al_2O_3$/p-type doped $In_{0.53}Ga_{0.47}As$ stack with a Pd gate on top of it after hydrogen anneal (C-FGA) according to preferred embodiments of the preferred embodiments of the disclosure. The HFIL is indicated in FIG. 4.
Figure 5:
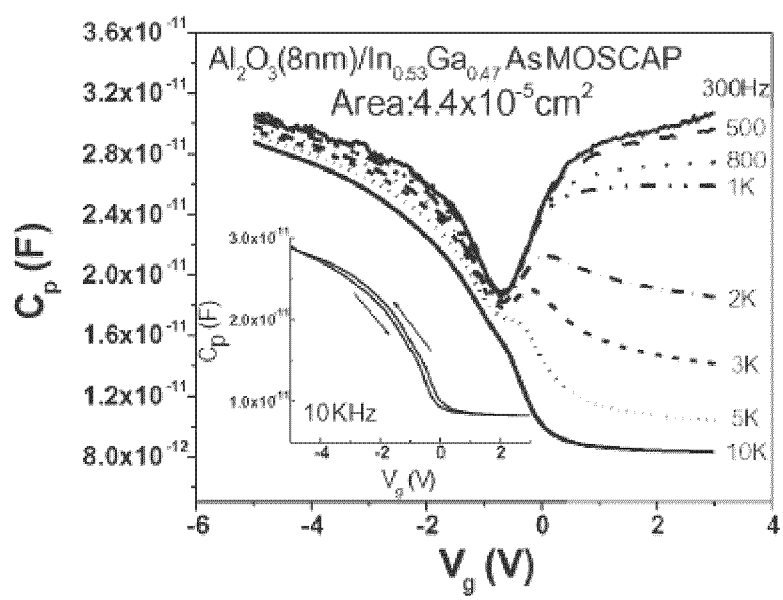
FIG. 5 (PRIOR ART) illustrates the CV curve of a device having an 8 nm $Al_2O_3$/p-type doped $In_{0.53}Ga_{0.47}As$ stack according to conventional capacitance/voltage characteristic interpretations without taking the adaptations according to Martens et al. into account.

Said FIG. 4 illustrates the capacitance-voltage (C-V) curve for a MOS capacitor sample having a 10 nm $Al_2O_3$/p-type doped $In_{0.53}Ga_{0.47}As$ stack with a Pd gate on top of it after hydrogen anneal (C-FGA) according to preferred embodiments of the preferred embodiments. The HFIL is indicated in FIG. 4. Similar results are expected for a MOSFET device.

A HFIL in the range of 10% is achieved for a high mobility MOSFET comprising at least
- a substrate,
- a Ge (SiGe) semiconductor compound formed on the substrate,
- a channel being formed in said Ge (SiGe) semiconductor compound,
- a first region within the Ge (SiGe) semiconductor compound doped with a p type dopant to form a drain of the MOSFET and a second region within the Ge (SiGe) semiconductor compound doped with a p type dopant to form a source of the MOSFET such that an P-MOSFET is formed, and
- a gate dielectric selected from $Al_2O_3$ formed on the Ge semiconductor compound, and
- a gate electrode being formed on top of the gate dielectric, provided that the interface of the gate dielectric/semiconductor compound is annealed using atomic hydrogen as described in preferred embodiments of the disclosure.

Figure 10A:
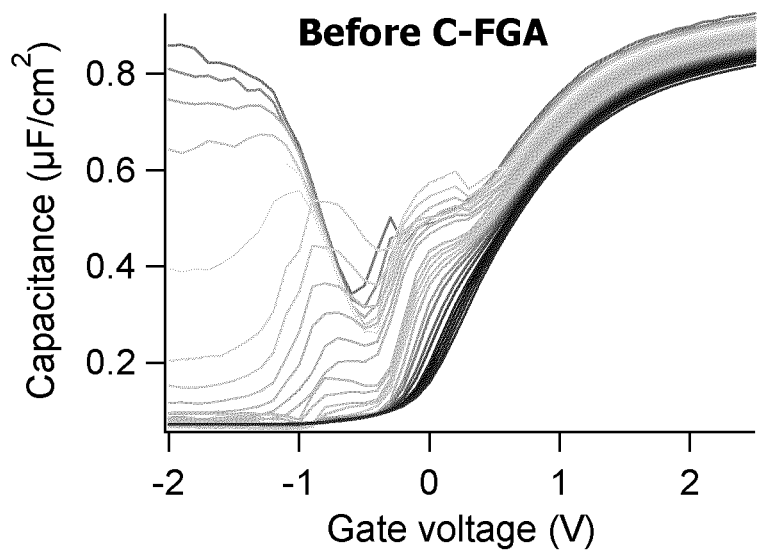
FIGS. 10A-10B illustrate a CV curve for a Ge MOS capacitor.
Figure 10B:
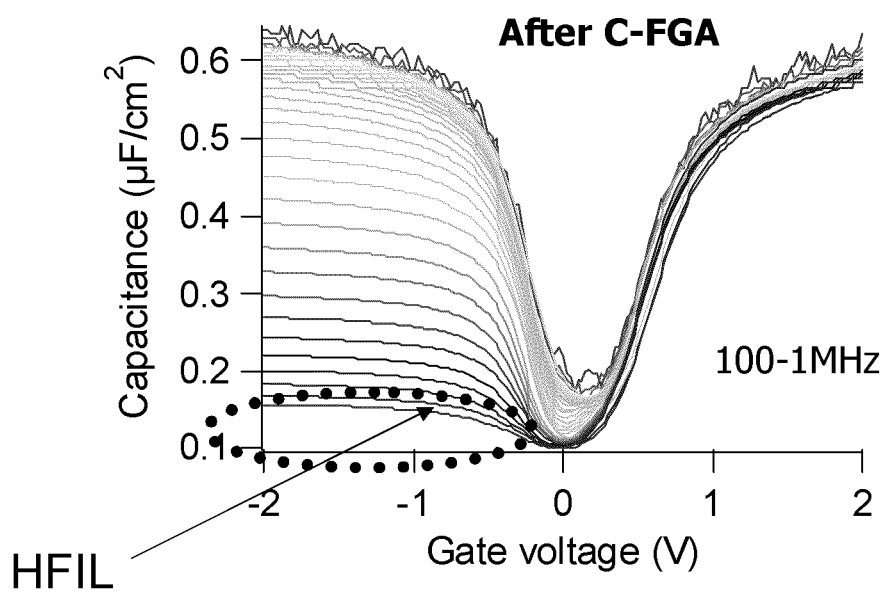

FIG. 10B illustrates the capacitance-voltage (C-V) curve for a MOS capacitor sample having a 10 nm $Al_2O_3$/p-type doped Ge stack with a Pd gate on top of it after hydrogen anneal (C-FGA) according to preferred embodiments of the preferred embodiments. The HFIL is indicated in FIG. 10B. Similar results are expected for a MOSFET device According to preferred embodiments a method is disclosed which aims at reducing (avoiding) Fermi Level pinning effects in a high mobility MOSFET by passivating the interface of a Ge or III-V compound based channel with the gate dielectric and in the meantime creating a (surface) quantum well at the interface of the Ge or III-V compound based channel with the gate dielectric. This means the carriers (electron) at the interface are acting as a 2 Dimensional electron gas (2 DEG). Compared to state of the art MOSFET as well as HEMT (high electron mobility transistor) structures based on III-V compound semiconductors it is the first time a field-induced surface quantum well is created and observed at the oxide-III-V interface. A large semiconductor band-bending at the oxide-high mobility channel interface forms a quantum well structure which confines free electrons (2DEG). The treatment method of the preferred embodiments has effectively passivated the upper-half of e.g. InGaAs (alternatively Ge) bandgap, which allows the InGaAs (Ge) surface Fermi-level to reach the conduction band edge resulting in large band-bending and the subsequent surface quantum well.

Using the method according to preferred embodiments to passivate the Ge or III-V compound interface using atomic hydrogen makes it possible to reduce electron trap densities to a level at which the Fermi-level could move vary close to the conduction band edge, giving rise to large band bending (>0.7 eV) and sharp quantum well at the gate oxide-high mobility channel interface (e.g. $Al_2O_3$/p-$In_{0.53}Ga_{0.47}As$ interface). In this case, the minority carriers are confined in the surface quantum well and form a very large inversion capacitance. The semi-conductor Fermi-Level at the $Al_2O_3$/$In_{0.53}Ga_{0.47}As$ interface is not only unpinned, but can move across the upper half of the bandgap (0.38-0.7 eV).

FIG. 1 illustrates a MOS stack suitable for creating a high mobility MOSFET with a surface quantum well at the interface of the Ge or III-V compound based channel with the gate dielectric.

According to preferred embodiments, the stack suitable for creating a high mobility MOSFET with a field-induced surface quantum well is formed onto a suitable substrate 1. Said stack is preferably comprising a 1 μm thick InGaAs ($In_{0.53}Ga_{0.47}As$) compound semiconductor layer 2 with a 10 nm ALD or MBE deposited gate dielectric layer ($Al_2O_3$) 3 on top of the InGaAs ($In_{0.53}Ga_{0.47}As$) compound semiconductor layer. Said InGaAs ($In_{0.53}Ga_{0.47}As$) compound semiconductor layer 2 may be optionally pretreated by dipping in a $(NH_4)_2S$ solution. On top of the $Al_2O_3$ gate dielectric layer a gate electrode 4 is provided, said gate electrode is preferably made of a noble metal selected from Pt and/or Pd.

According to preferred embodiments, a high mobility MOSFET device comprising a field-induced surface quantum well at the gate dielectric/high mobility compound semiconductor (Ge or III/V) interface is disclosed using the hydrogen annealing method of the preferred embodiments as described in previous embodiments to avoid Fermi level pinning effects. Using said method in combination with a specific gate dielectric—high mobility compound semiconductor stack (Ge or III/V) it is possible to create a (surface) quantum well at the interface of the gate dielectric/compound semiconductor. The metal oxide semiconductor field-effect transistor (MOSFET) disclosed is preferably comprising a high mobility compound based channel selected from Ge or $In_{0.53}Ga_{0.47}As$, a gate dielectric wherein a (surface) quantum well is created and observed at the gate oxide-semiconductor compound based channel interface.

According to preferred embodiments, a MOSFET device comprising a high mobility III-V compound based channel is disclosed having a (surface) quantum well (also referred to as a high mobility MOSFET having a field-induced surface quantum well). Said device preferably comprises at least:
- a substrate,
- an $In_{0.53}Ga_{0.47}As$ semiconductor compound formed on the substrate
- a channel being formed in said $In_{0.53}Ga_{0.47}As$ semiconductor compound,
- a first region within the $In_{0.53}Ga_{0.47}As$ semiconductor compound doped with a second dopant type to form a drain of the MOSFET and a second region within the $In_{0.53}Ga_{0.47}As$ semiconductor compound doped with the second dopant type to form a source of the MOSFET, and
- a gate dielectric being formed on the $In_{0.53}Ga_{0.47}As$ semiconductor compound through atomic layer deposition, and
- a gate electrode being formed on top of the gate dielectric.

According to preferred embodiments the high mobility N-MOSFET having a field-induced surface quantum well is having a substrate with an InGaAs ($In_{0.53}Ga_{0.47}As$) semiconductor compound formed on the substrate, a first region within the InGaAs ($In_{0.53}Ga_{0.47}As$) semiconductor compound being doped with an n-type dopant to form the drain of the N-MOSFET and a second region within the InGaAs ($In_{0.53}Ga_{0.47}As$) semiconductor compound being doped with an n-type dopant to form the source of the N-MOSFET.

According to an alternative preferred embodiments, a MOSFET device comprising a high mobility Ge (SiGe) compound based channel is disclosed having a (surface) quantum well (also referred to as a high mobility MOSFET having a (field-induced) surface quantum well) Said device is preferably comprising at least:
- a substrate,
- a Ge semiconductor compound formed on the substrate,
- a channel being formed in said Ge (SiGe) semiconductor compound,
- a first region within the Ge (SiGe) semiconductor compound doped with a second dopant type to form a drain of the MOSFET and a second region within the Ge semiconductor compound doped with the second dopant type to form a source of the MOSFET, and
- a gate dielectric being formed on the Ge semiconductor compound through atomic layer deposition, and
- a gate electrode being formed on top of the gate dielectric.

According to preferred embodiments the high mobility P-MOSFET having a field-induced surface quantum well is having a substrate with Ge (SiGe) semiconductor compound formed on the substrate, a first region within the Ge (SiGe) semiconductor compound being doped with an p-type dopant to form the drain of the P-MOSFET and a second region within the Ge (SiGe) semiconductor being doped with a p-type dopant to form the source of the P-MOSFET.

According to preferred embodiments, the gate electrode in the high mobility MOSFET having a field-induced surface quantum well is selected from a noble metal and the interface of the gate dielectric/high mobility compound is passivated using C-FGA as described in previous embodiments.

According to preferred embodiments, the gate electrode in the high mobility MOSFET having field-induced surface quantum well is selected from a metal and the interface of the gate dielectric/high mobility compound semiconductor is passivated using atomic hydrogen as described in previous embodiments.

According to preferred embodiments the surface quantum well is achieved within the high mobility MOSFET device by passivating the interface between the gate oxide and the high mobility semiconductor compound. Said passivation is performed using the method of the preferred embodiments making use of atomic hydrogen.

Alternatively and also preferred, the hydrogen anneal is applied twice, a first hydrogen anneal step before depositing the gate electrode and a second hydrogen anneal step after depositing the gate electrode or in other words after creation of the MOSFET structure. In yet another alternative the hydrogen anneal is applied before depositing the gate electrode.

EXAMPLES

Example 1

Figure 6:
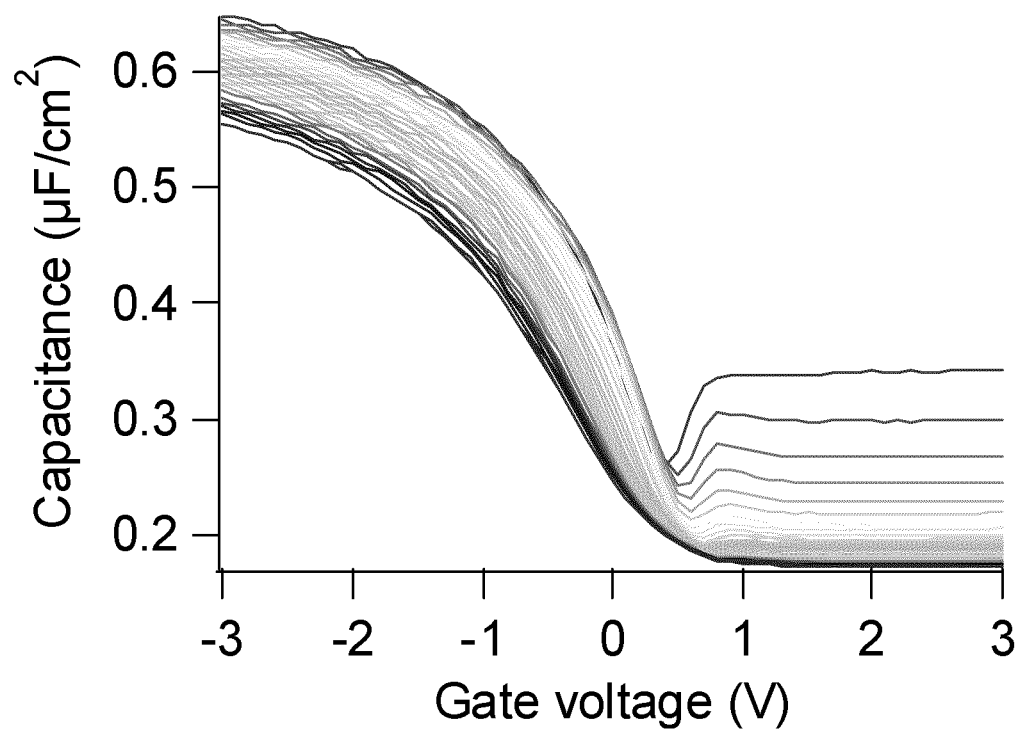
FIG. 6 illustrates a CV curve according to preferred embodiments of the disclosure for an $In_{0.53}Ga_{0.47}As$ MOS capacitor illustrating true inversion response and having a bias independent characteristic at inversion. The MOS capacitor was measured from 1 KHz to 1 MHz, with a total of 30 frequencies.
Figure 7:
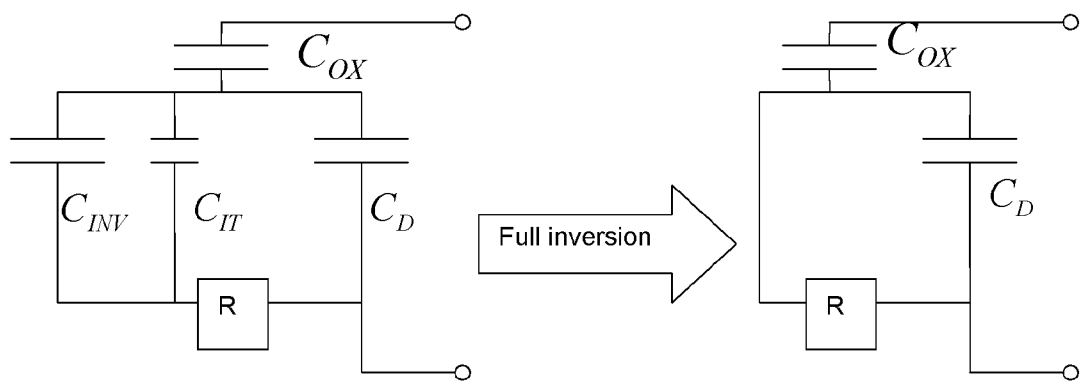
FIG. 7 illustrates the MOSFET Inversion circuit model (PRIOR ART). The resistive element R models the 'communication path' between the majority carrier band and the minority carrier band.

The Proof of a Field-Induced Surface Quantum Well at the Gate Oxide-InGaAs Interface The measured inversion capacitance due to minority carrier response (generation-recombination or diffusion) becomes independent of gate bias as soon as the gate bias moves past the CV $D_{it}$ bump. This behavior is illustrated in the measured CV traces (from 1 KHz to 1 MHz) plotted in FIG. 6 for a high mobility p-type $In_{0.53}Ga_{0.47}As$ MOS capacitor. The gate bias independence is the signature of true MOS capacitor inversion behavior. Equivalent MOS capacitor inversion circuits are shown in FIG. 7 explaining the inversion CV traces seen in FIG. 6. FIG. 6 illustrates CV traces of a p-type $In_{0.53}Ga_{0.47}As$ MOS capacitor illustrating true inversion response. A bias independent characteristic at inversion has to be noticed. The MOS capacitor was measured from 1 KHz to 1 MHz, with a total of 30 frequencies.

At weak inversion, the minority carriers attracted to the InGaAs surface form finite inversion capacitance $C_{INV}$, in parallel with interface trap capacitance $C_{IT}$ and depletion capacitance $C_D$ as shown by the left-hand side circuit of FIG. 7. Notice that $C_{INV}$ and $C_{IT}$ are not directly interacting with the majority carrier band and the back contact. Because of their minority carrier nature, $C_{INV}$ and $C_{IT}$ interact with the majority carrier band (back contact) via a virtual 'communication path' across the bandgap. That is, the back contact and the majority carrier band communicate with the minority carrier band through generation-recombination or diffusion processes. This communication path can be modeled as electrical current passing through a resistive element R. This resistive element R represents the collective effects of minority carrier diffusion (as for $In_{0.53}Ga_{0.47}As$ and Ge at room temperature) and/or generation/recombination (as the case for Si at room temperature). Notice that R is frequency, temperature and substrate dependent.

At one given frequency, the communication path (resistive element R) has certain conductivity (or resistivity) value indicating how easy (or how difficult) it is for minority carriers to follow the ac signal between the gate and back contact. At low frequency as well as transition frequencies (neither low frequency nor high frequency), the inversion capacitance is being charged up through the communication path (R) as the MOS capacitor moves towards full inversion. This corresponds to the 0.5V to 1V gate bias of the 1 KHz CV trace of FIG. 6. Strong inversion is reached at 1V gate bias, meaning that the inversion capacitance $C_{INV}$ is being charged to a point that its capacitance value increases exponentially with gate bias, and becomes significantly larger than all the other capacitances, including Cox. The large capacitance of $C_{INV}$ shorts the combined circuit of $C_{INV}$ and $C_{IT}$, leading to the equivalent circuit illustrated on the right-hand side of FIG. 7. Increasing gate bias will keep increasing $C_{INV}$, but that will have very little effect on the short circuit configuration. Meanwhile, the depletion capacitance $C_D$ and its corresponding depletion width remain unchanged beyond 1V gate bias because the depletion region is completely shielded by the now almost infinite $C_{INV}$ from gate bias change and the corresponding electric field increase. This explains the flat capacitance value from 1V gate bias and above.

For low frequency ac signal the above situation remains valid, with the condition that the communication path (R) is highly conductive because the minority carriers can follow the ac signal completely. This results in shorting the depletion capacitance $C_D$ and achieves full inversion capacitance at Cox. For high frequencies, the communication path (R) becomes highly resistive because the minority carriers are unable to follow the ac signal (whether diffusion or generation-recombination) and results in an open circuit. The measured capacitance then becomes $C_{OX}$ in series with $C_D$, resulting in the typical 'high frequency' or $C_{MIN}$ capacitance.

Example 2

The Proof of Field-Induced Surface Quantum Well at the Sate Oxide-Ge Interface

For FIG. 10 illustrates CV traces at room temperature of an n-type high mobility Ge MOS capacitor before (FIG. 10A) and after (FIG. 10B) performing the catalytic FGA according to preferred embodiments of the preferred embodiments illustrating true inversion response. The MOS-Cap stack used is an n-type doped Ge substrate with 1 nm GeOx top surface layer, a 10 nm thick MBE deposited $Al_2O_3$ gate dielectric and a Pt (Pd) gate electrode on top of the gate dielectric.

A bias independent characteristic at inversion has to be noticed. The MOS capacitor was measured from 100 KHz to 1 MHz, with a total of 30 frequencies. The CV graph in FIG. 10A performed on the nGe/$Al_2O_3$ MOS CAP before C-FGA illustrates poor inversion due to high $D_{it}$ ($D_{it}$ peak>$E^{12}$ which is well known as a "V" shape $D_{it}$). The CV graph in FIG. 10B performed on the nGe/$Al_2O_3$ MOS CAP after C-FGA illustrates very good inversion, low dispersion at accumulation (Dit (e-trap) in depletion is low~$E^{11}$) and formation of a High Frequency Inversion Lift (HFIL). The HFIL reflects the phenomenon in which the CV reveals a step up at strong inversion even at high frequencies.

Figures 9A, 9B:
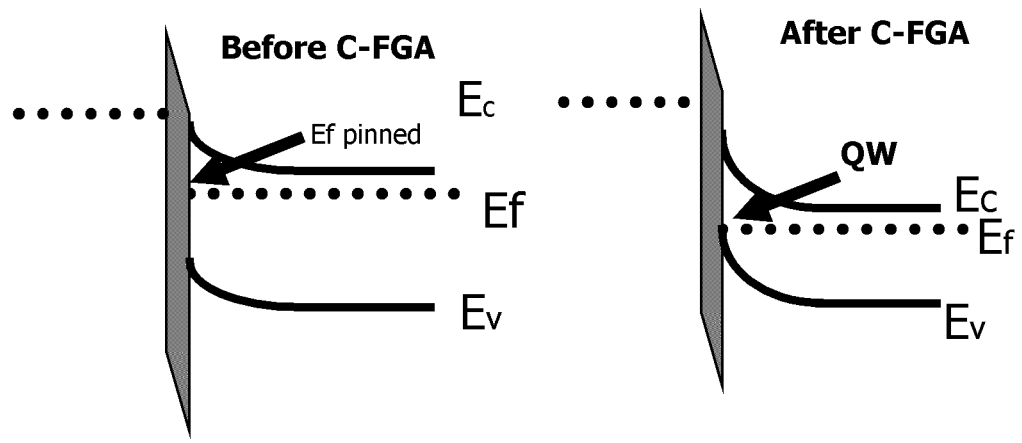
FIGS. 9A-9B illustrate Ge field-induced surface quantum well formation in a high mobility Ge MOS capacitor stack according to preferred embodiments of disclosure.

FIGS. 9A-9B illustrate Ge surface quantum well formation in a high mobility Ge MOS capacitor stack according to preferred embodiments of the preferred embodiments. FIG. 9A illustrates the behavior at 1 MHz without performing the C-FGA; FIG. 9B illustrates the behavior at 1 MHz after performing the C-FGA according to preferred embodiments of the preferred embodiments thereby illustrating a true inversion at 1 MHz and formation of a quantum well. The 1 MHz inversion seen on FIG. 9B is temperature-independent and even occurs at 77 k where most minority carrier generation is suppressed. The 1 MHz inversion is also frequency independent.

Example 3

Measurements Showing Duality of the Ge/InGaAs MOSCAPs

FIG. 13 compares side by side the n and p type C-V traces of the Ge and InGaAs MOSCAPs at room temperature. FIG. 13 illustrates a p-type Ge MOSCAP (FIG. 13A), an n-type Ge MOSCAP (FIG. 13B), an InGaAs n-type MOSCAP (FIG. 13C) and an InGaAs n-type MOSCAP (FIG. 13D). The duality between the Ge and InGaAs MOSCAPs is clearly visible through the mirror-image like C-V pairs. Low frequency dispersion and very small flat-band voltage shifts observed on the C-V accumulation sides of FIGS. 13(A) and 13(C) point to free-moving Fermi-levels and relatively low Dit.

Figure 11:
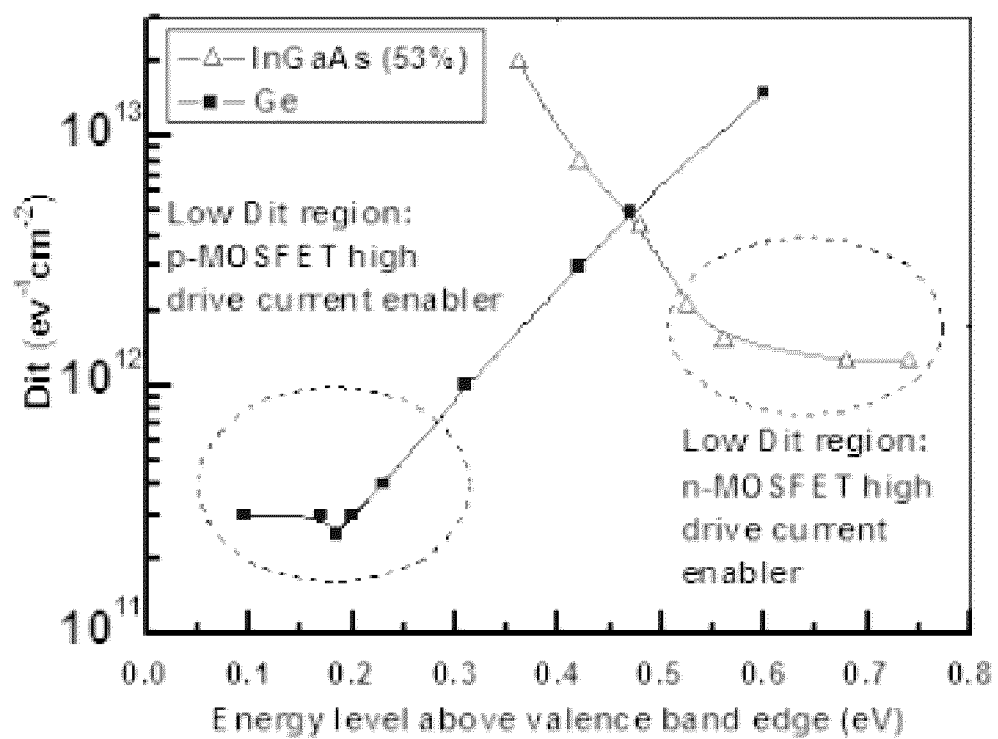
FIG. 11 illustrates $D_{it}$ distributions of the Ge and InGaAs MOSCAPs according to preferred embodiments of disclosure.

FIG. 11 shows the mirror-image like Dit(E) distributions of the Ge and the InGaAs MOSCAPs under the CGS approach. The Dit(E) is deduced from the measured G-V data via the conductance method and the charge trapping characteristics. Relatively low Dit levels near the Ge valence band and the $In_{0.53}Ga_{0.47}As$ conduction band edges warrant high drive current and excellent mobility performance of the N and P MOSFETs.

Figure 12:
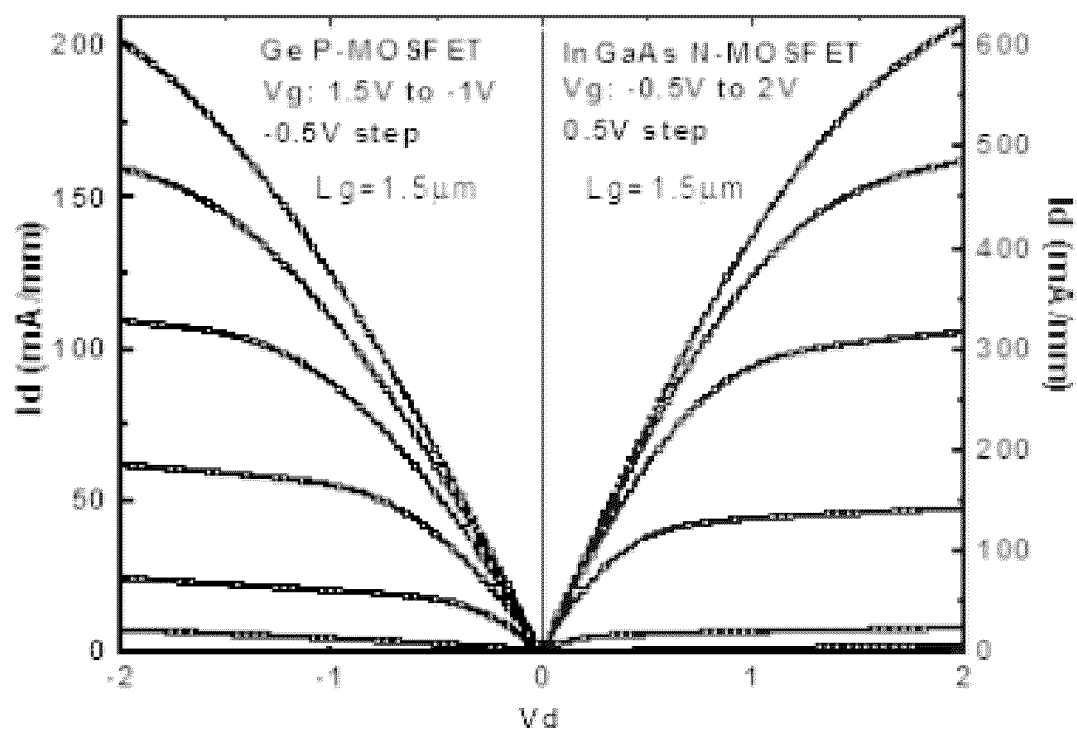
FIG. 12 illustrates Id-Vd plots of a 1.5 μm Ge P-MOSFET and InGaAs N-MOSFET according to preferred embodiments of disclosure.
Figure 13A:
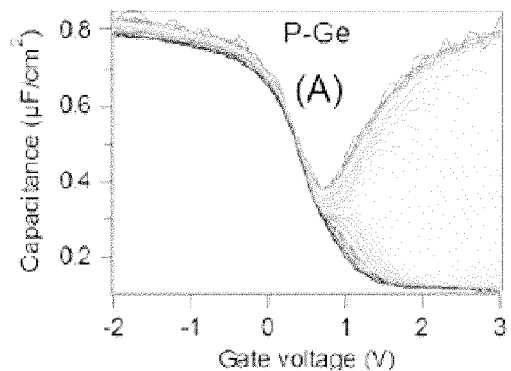
FIGS. 13A-13D illustrate C-V curves of Ge and InGaAs MOSCAPs according to preferred embodiments of disclosure: a p-type Ge MOSCAP (FIG. 13A), an n-type Ge MOSCAP (FIG. 13B), an InGaAs n-type MOSCAP (FIG. 13C) and an InGaAs n-type MOSCAP (FIG. 13D).
Figure 13C:
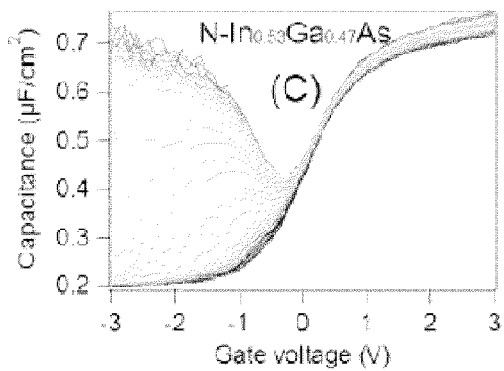
Figure 13B:
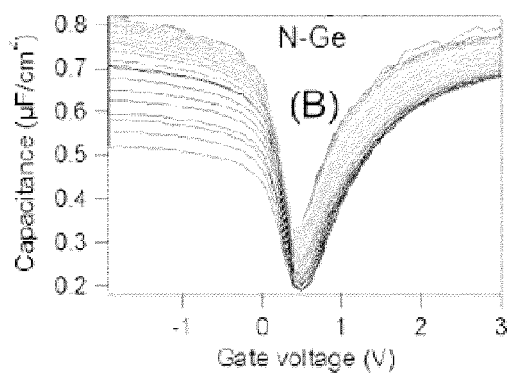
Figure 13D:
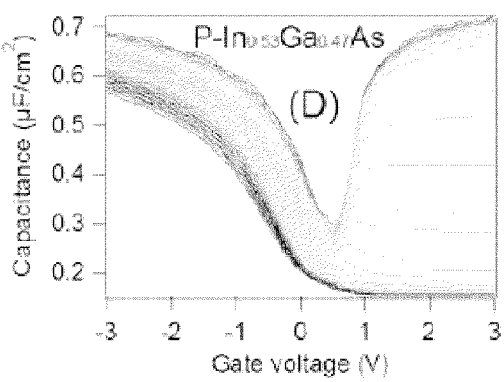

The Ge and InGaAs MOSFETs have achieved very encouraging performance. FIG. 12 illustrates the I-V characteristics of a 1.5 μm Ge P-MOSFET and InGaAs N-MOSFET. Large drive currents were obtained on the 1.5 μm transistors while longer channel transistors exhibit peak hole and electron field-effect mobility values up to 400 $cm^2$/eV-s and 1300 $cm^2$/eV-s, respectively.

All references cited herein are incorporated herein by reference in their entirety. To the extent publications and patents or patent applications incorporated by reference contradict the disclosure contained in the specification, the specification is intended to supersede and/or take precedence over any such contradictory material.

The above description discloses several methods and materials of the present disclosure. This disclosure is susceptible to modifications in the methods and materials, as well as alterations in the fabrication methods and equipment. Such modifications will become apparent to those skilled in the art from a consideration of this disclosure or practice of the preferred embodiments disclosed herein. Consequently, it is not intended that this disclosure be limited to the specific embodiments disclosed herein, but that it cover all modifications and alternatives coming within the true scope and spirit of the preferred embodiments as embodied in the attached claims.

What is claimed is:

1. A method for reducing Fermi Level Pinning in a high mobility metal oxide semiconductor device, the method comprising:
   providing a high mobility semiconductor on a substrate to form a channel of the metal oxide semiconductor device, wherein the high mobility semiconductor is selected from the group consisting of Ge, SiGe, Group III-V compounds, and combinations thereof;
   forming a gate dielectric on the high mobility semiconductor;
   providing a gate electrode onto the gate dielectric to form a gate of the metal oxide semiconductor device, wherein the gate electrode comprises a noble metal; and thereafter performing an anneal with atomic hydrogen for at least 5 minutes, wherein the anneal is performed using a catalytic forming gas anneal in a presence of the noble metal.

2. The method of claim 1, wherein the noble metal is selected from the group consisting of Pt, Pd, and combinations thereof.

3. The method of claim 1, wherein the noble metal is Pt.

4. The method of claim 1, wherein the anneal with atomic hydrogen is an atomic hydrogen anneal using a remote plasma.

5. The method of claim 1, wherein the Group III-V compound is InGaAs.

6. The method of claim 1, wherein the Group III-V compound is $In_xGa_{1-x}As$ with $x>0.5$.

7. The method of claim 1, wherein the Group III-V compound is $In_{0.53}Ga_{0.47}As$.

8. The method of claim 1, wherein the high mobility semiconductor is Ge or $Si_xGe_{1-x}$ with $x<0.3$.

9. The method of claim 8, wherein the high mobility semiconductor is annealed to achieve a $GeO_2$ top surface layer.

10. The method of claim 1, further comprising removing native oxides from a surface of the high mobility semiconductor by dipping in a solution of from 40 wt. % to 48 wt. % $(NH_4)_2S$ for at least 5 minutes, wherein removing the native oxides is conducted before forming the gate dielectric.

11. The method of claim 10, wherein the native oxides are removed from the surface of the high mobility semiconductor by dipping in the solution for from 5 to 10 minutes.

12. The method of claim 1, wherein the gate dielectric comprises $Al_2O_3$ or $LaAlO_3$ formed through atomic layer deposition or molecular beam epitaxy.

13. The method of claim 1, wherein the anneal with atomic hydrogen is performed for at least 5 minutes at a temperature of from 200° C. to 500° C.

14. The method of claim 1, wherein the anneal with atomic hydrogen is performed for 5 to 30 minutes at a temperature of from 300° C. to 400° C.

15. The method of claim 1, wherein a first region and a second region are formed in the high mobility semiconductor and are doped with an n-type dopant to form a drain and a source of an N-MOSFET device.

16. The method of claim 1, wherein a first region and a second region are formed in the high mobility semiconductor and are doped with a p-type dopant to form a drain and a source of a P-MOSFET device.

17. The method of claim 1, wherein the noble metal is Pd.

18. The method of claim 1, wherein performing the anneal obtains a high frequency inversion lift from 10% to 20%.

19. The method of claim 1, wherein performing the anneal reduces electron trap densities to a level at which a Fermi-level moves close to a conduction band edge, giving rise to a band bending of greater than 0.7 eV and a surface quantum well at a gate dielectric-high mobility semiconductor interface.

20. The method of claim 1, wherein the high mobility metal oxide semiconductor device comprises a field-induced surface quantum well at a gate dielectric-high mobility semiconductor interface.

* * * * *

UNITED STATES PATENT AND TRADEMARK OFFICE
CERTIFICATE OF CORRECTION

PATENT NO. : 8,524,562 B2  
APPLICATION NO. : 12/560282  
DATED : September 3, 2013  
INVENTOR(S) : Wang et al.

Page 1 of 1

It is certified that error appears in the above-identified patent and that said Letters Patent is hereby corrected as shown below:

In the Specification

In column 15 at line 11, Change "Cox." to --$C_{ox.}$--.

In column 15 at line 27, Change "Cox." to --$C_{ox.}$--.

Signed and Sealed this  
Twenty-fourth Day of June, 2014

Michelle K. Lee  
*Deputy Director of the United States Patent and Trademark Office*